(12) United States Patent
Sangu

(10) Patent No.: US 6,252,649 B1
(45) Date of Patent: Jun. 26, 2001

(54) ALIGNER

(75) Inventor: Katsuya Sangu, Tokyo (JP)

(73) Assignees: Adtec Engineering Co., Ltd., Tokyo; Canon Components, Inc., Saitama-ken, both of (JP)

(*) Notice: Subject to any disclaimer, the term of this patent is extended or adjusted under 35 U.S.C. 154(b) by 0 days.

(21) Appl. No.: 09/241,902

(22) Filed: Feb. 2, 1999

(30) Foreign Application Priority Data

Jul. 31, 1996 (JP) .................................... 8-217841
Aug. 13, 1996 (JP) .................................... 8-231490

(51) Int. Cl.$^7$ .................................... G03B 27/42
(52) U.S. Cl. .................................... 355/53
(58) Field of Search .................................... 355/53, 67; 356/399, 356/400; 250/492.2, 492.22

(56) References Cited

U.S. PATENT DOCUMENTS 5,777,747 * 7/1998 Tanaka .................................... 356/401
5,894,056 * 4/1999 Kakizaki et al. .................................... 430/5

* cited by examiner

Primary Examiner—Safet Metjahic
Assistant Examiner—E P LeRoux
(74) Attorney, Agent, or Firm—Nields & Lemack

(57) ABSTRACT

The invention is to provide an aligner which may produce the printed circuit works having no defects due to the incomplete alignment of the film-mask and the work, wherein the film-mask F having aligning marks 3 and the work K having aligning marks 4 are closely contacted with each other, and then the aligned conditions of the aligning marks 3 and 4 are detected, if the aligned conditions are detected to be out of the range of a predetermined tolerance, the close contact of the film-mask F and the work K is canceled, and the same aligning operation is repeated until the aligned conditions are detected to be within the range of a predetermined tolerance, so that the products of inferior quality may be prevented from being produced due to the incomplete alignment.

8 Claims, 6 Drawing Sheets

ALIGNER

BACKGROUND THE INVENTION AND RELATED ART STATEMENT

The present invention relates to an aligner.

The photolithography method has been recently employed to produce the printed circuit works, wherein the negatives of circuit patterns to be formed are used so as to be projectingly exposed so that the circuit patterns may be printed to the works by way of photo-etching.

At the time of exposure, it is required to exactly align the film-mask and the work. Normally the work is secured to a mount by way of vacuum suction or the like. The film-mask and the work are oppositely positioned with a space of approximately 0.5 mm being provided therebetween, and then the work and the film-mask are aligned while these are photographically treated.

Although the film-mask and the work may be exactly aligned with each other with a space being provided therebetween, it may happen that the film-mask and the work will positionally displace with each other when the film-mask and the work are closely contacted at the time of exposure. This will often raise a problem of producing the products of inferior quality.

It is an object of the invention to provide an aligner for eliminating the defect or disadvantage of the prior art as mentioned above.

SUMMARY OF THE INVENTION

In order to attain the above mentioned object, the aligner of the invention substantially comprises: an aligning device for relatively move and align a mask having a pattern depicted thereon to be exposed and an object having a photosensitive layer to be subject to the exposure through the mask; a contacting device for closely contacting the aligned mask and object; a detecting device for detecting the alignment accuracy of the closely contacted mask and object; said aligning device being operated to separate the mask and the object from each other when the alignment of the closely contacted mask and object is detected out of a predetermined tolerance and to align the mask and the object again; and an exposure apparatus for exposing the object having the mask closely contacted thereto.

According to the combination of the elements as mentioned above, the alignment accuracy of the closely contacted mask and object is detected. When the alignment is detected out of a predetermined tolerance, the exposure is not performed and the close contact between the mask and the object is canceled and then the mask and the object are aligned again. This operation is repeatedly performed until the alignment accuracy as closely contacted comes into the a range of predetermined tolerance. It is therefore apparent that this method will prevent the production of products of inferior quality which may otherwise be produced due to the incomplete alignment of the closely contacted mask and object.

DETAILED DESCRIPTION OF PREFERRED EMBODIMENT

The present invention will now be described in reference to the embodiments as shown in the attached drawings.

Figure 1:
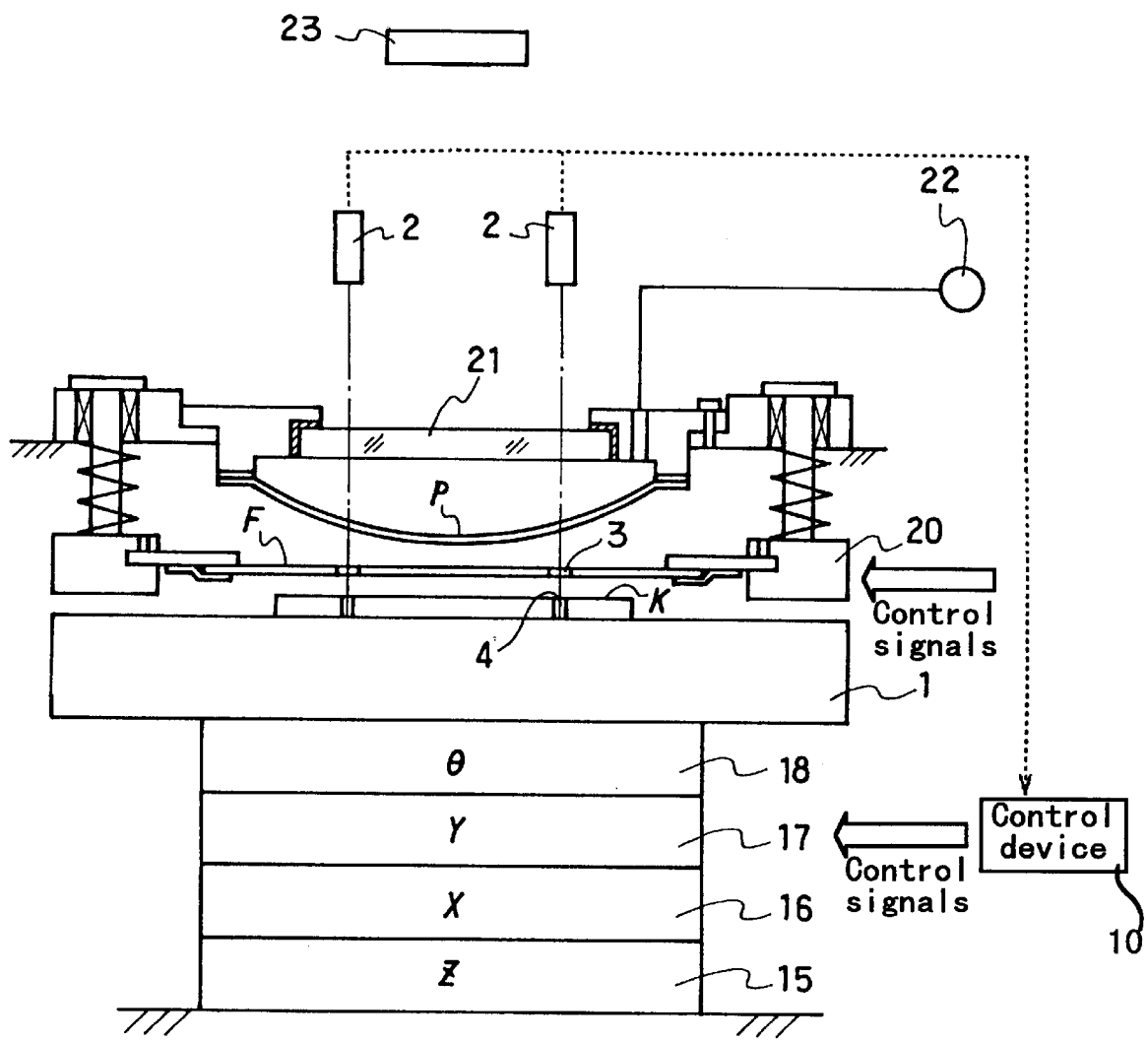
FIG. 1 is a block diagram showing an embodiment of the invention.
Figure 1:
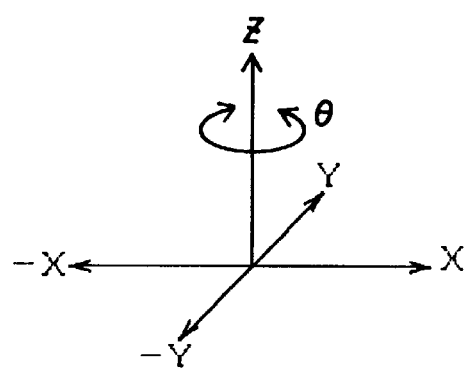

In FIG. 1, a platen 1 has a work K mounted thereon in a condition that the work is attracted thereto by the vacuum suction of a sucking device (not shown). The platen 1 is movable in the directions x, y, z and θ by means of Z stage 15, X stage 16, Y stage 17 and θ stage 18 which are operated to move the work K under the control of a control device 10.

Above the platen 1, a film-mask F is supported by a film-mask support 20. Above the film-mask F, there are provided a pressure film P, a transparent glass 21 and a light source 23. Above the transparent glass 21, there is provided a pair of CCD cameras 2 which are employed to confirm the alignment between the aligning marks 3 of the film-mask F and the aligning marks 4 of the work K. Namely the control device 10 is operated in response to the information from the CCD cameras 2 to move the X stage 16, Y stage 15 and the θ stage 18 and accordingly the platen 1 so that the aligning marks 4 of the work K may be in alignment with the aligning marks 3 of the film-mask F, thereby to align the work K with the film mask F.

The control device 10 is operated at first to lift the work K by means of the Z stage 15 until the work comes to a position where a predetermined space is obtained between the work K and the film-mask F. Subsequently the control device 10 is operated in response to the information from the CCD cameras 2 to move the platen 1 with respect to the film-mask F by means of the X stage 16, Y stage 17 and θ stage 18, so as to align the aligning marks 4 of the work K with the aligning marks 3 of the film-mask F.

After the alignment of the film-mask F and the work K is finished, the control device 10 is operated to further lift the platen 1 while a pressure fluid is introduced from a pressure source 22 onto the rear side of the pressure film P to expand the pressure film P. The pressure film P is expanded to press the film-mask F against the work K to closely contact the former to the latter. Then the control device 10 is responsive to the information from the CCD cameras 2 to measure the aligned conditions between the aligning marks 3 of the film-mask F and the aligning marks 4 of the work K. If the displacements between the aligned marks are detected to be within the range of a predetermined tolerance, the control device 10 will operate the light source 23 to irradiate a light to expose the closely contacted film-mask F and work K.

If the displacements between the aligned marks are detected to be out of the range of a predetermined tolerance, the control device 10 will operate the pressure source 22 and accordingly the pressure film P to separate the film-mask F and the work K from each other. The control device 10 is again responsive to the information from the CCD cameras 2 to move the X, Y, Z and θ stages to align the work K with the film-mask F, and then closely contact the film-mask F against the work K and measure again the aligned conditions of the aligning marks 3 and 4. The same operations are repeated until the aligning marks 3 and 4 come to be aligned with the displacements being within the range of a predetermined tolerance.

Figure 2:
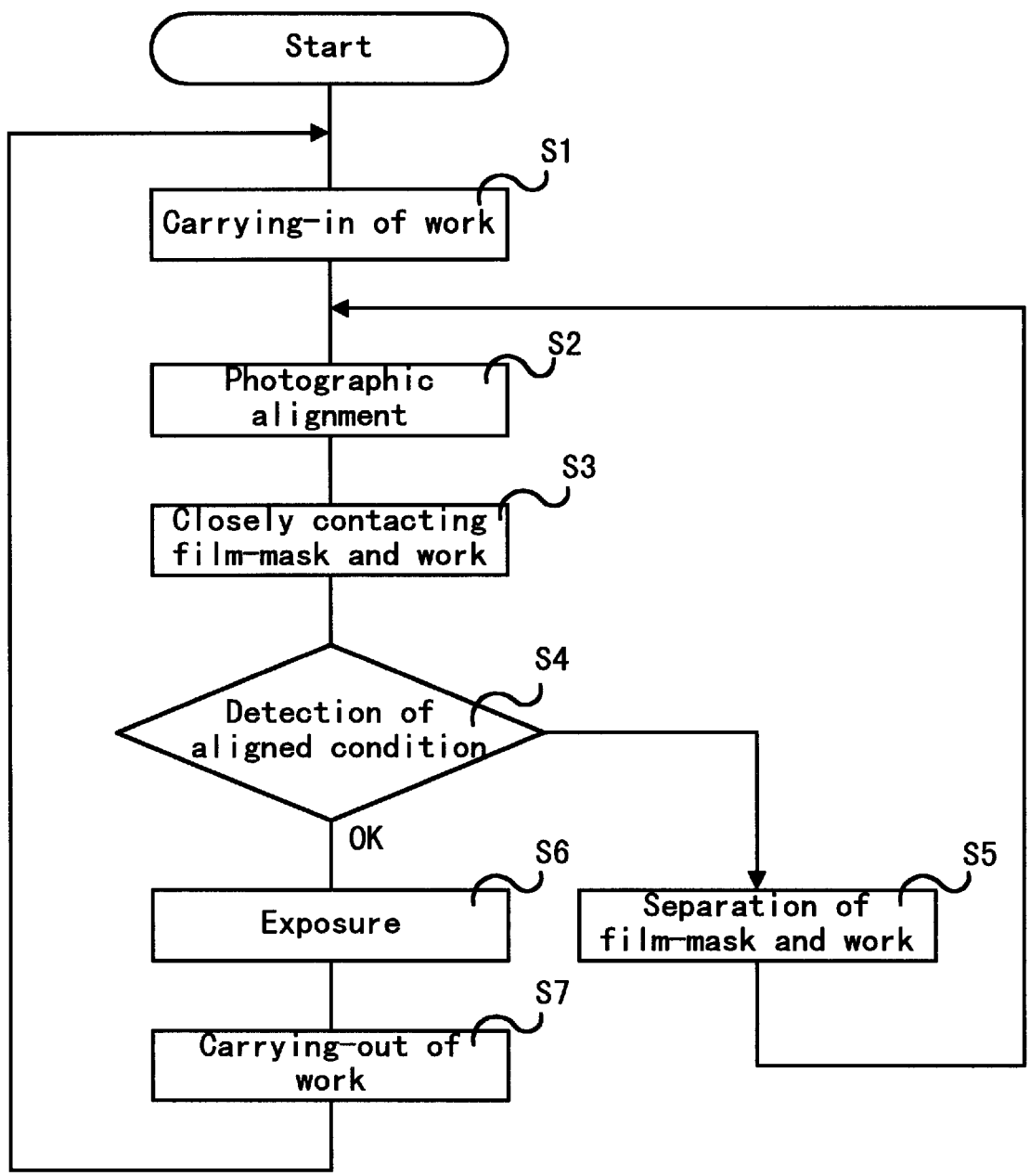
FIG. 2 is a flow chart showing the operations of the embodiment of the invention.

FIG. 2 shows the sequence of operations the aligner of this invention.

When the work K is carried in (step S1), the control device 10 is responsive to the photographic signals from the CCD cameras 2 to align the aligning marks 3 and 4 of the film-mask F and the work K with a predetermined space maintained therebetween (step S2). Subsequently the film-mask F and the work K are closely contacted with each other (step S3). In this state, the aligned condition between the aligning marks 3 and 4 is detected (step S4). If the aligned condition is detected to be out of the range of a predetermined tolerance, the closely contacted condition of the film-mask F and the work K is canceled (step S5), and the routine is returned to step S2. If the aligned condition is detected to be within the range of a predetermined tolerance, the film-mask F and the work K are exposed (step S6), and then subsequently carried out (step S7).

With the combination of the elements and the operations thereof as mentioned above, it may be possible to prevent the products of inferior quality from being produced due to the incomplete alignment of the film-mask F and the work K.

As mentioned above, the products of inferior quality will not be produced due to the incomplete alignment, since the alignment of the film-mask and the work is repeated when a delicate displacement is detected at the time of close contact.

The other embodiment of the aligner of this invention will be described.

The work K may be carried to above the platen 1 by a belt conveyer or the like. However it often happens that the work K as carried is not exactly positioned with respect to the platen 1, which is the exposure mount, where the work K is not completely in view of the camera lenses. In this case, the operations for aligning the film-mask and the work can not be performed, and therefore the work must be carried out of the system. This will considerably reduce the operation efficiency of the aligner.

Figure 3:
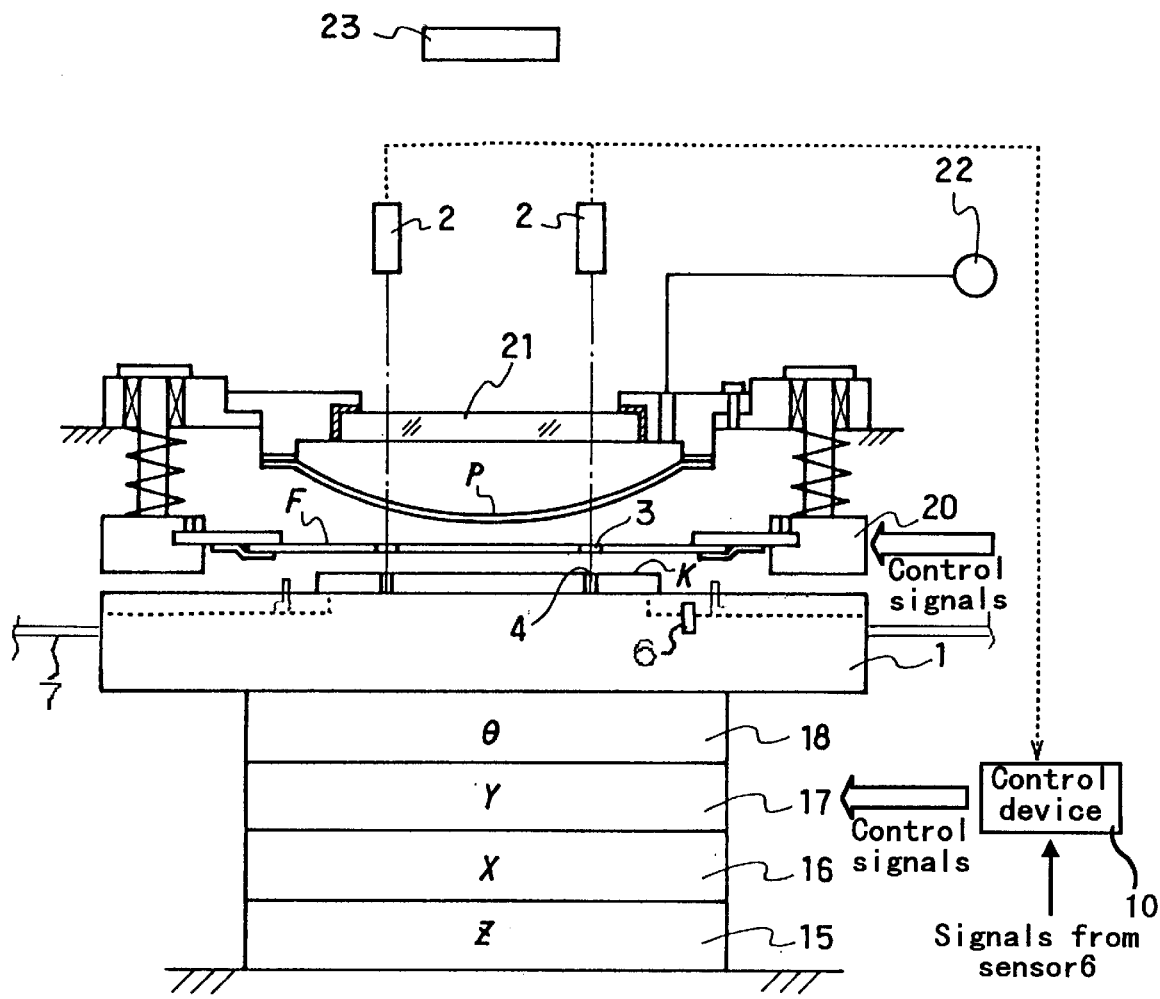
FIG. 3 is a block diagram showing another embodiment of the invention.

Such a defect may be eliminated by the embodiment. In FIG. 3, the work K as carried in is attracted to the platen 1 by the vacuum suction of a sucking device (not shown). The platen 1 is movable in the directions x, y, z and θ by means of Z stage 15, X stage 16, Y stage 17 and θ stage 18 which are operated to move the work K under the control of a control device 10.

The above construction is the same as the embodiment of FIG. 1.

Figure 4:
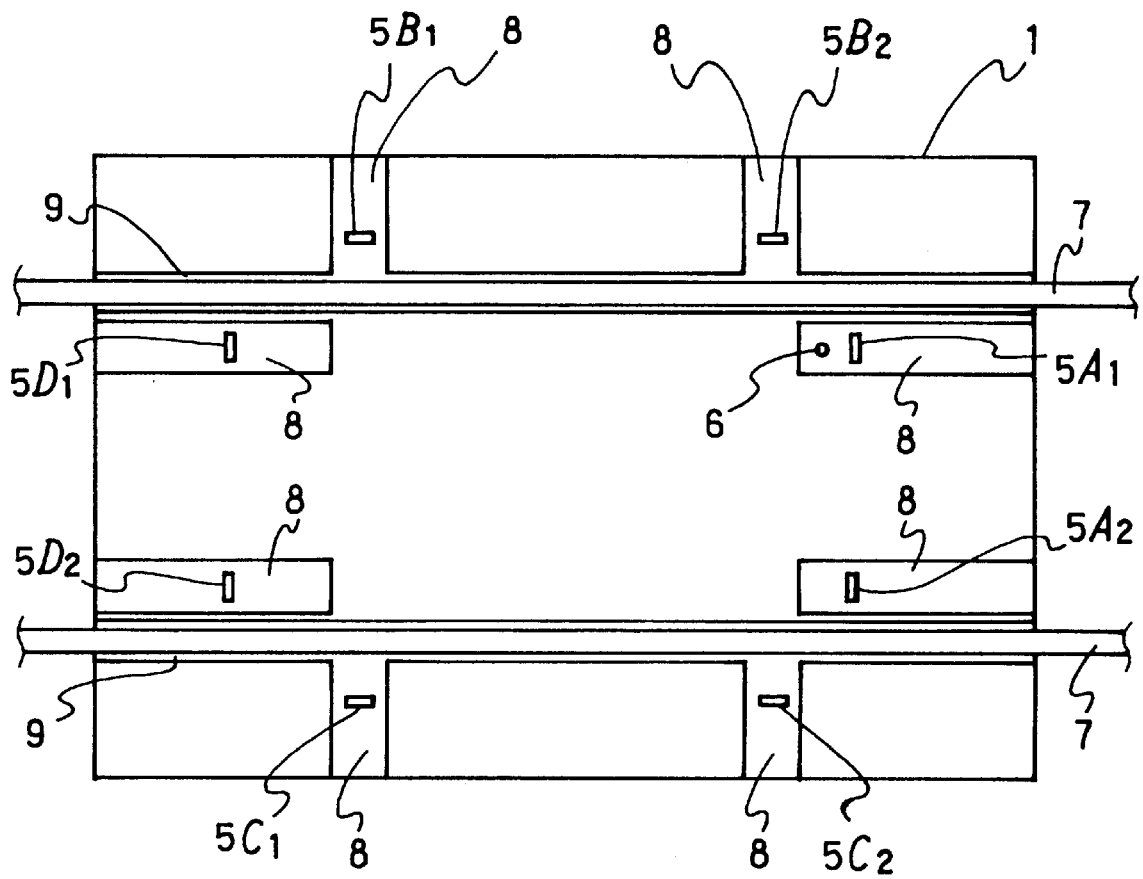
FIG. 4 is a plan elevational view of a platen 1 of the embodiment.
Figure 5:
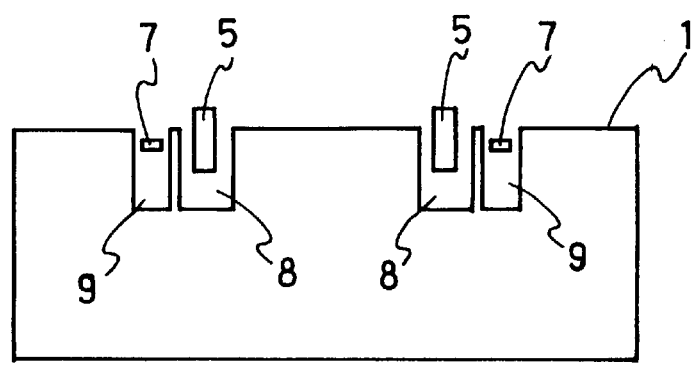
FIG. 5 is a side elevational view of the platen 1 of the embodiment.

The work K is carried in from the preceding process so as to be mounted on the platen 1. As shown in FIGS. 4 and 5 the platen 1 has grooves 9 for a belt conveyer 7 provided thereon. The work K is carried in by the belt conveyer 7 while the platen 1 is lowered, and the platen 1 is lifted when the work K is mounted on the platen 1.

As particularly shown in FIG. 4, the platen 1 has eight positioning devices 5 in all, namely two positioning devices provided at each of the four sides thereof, so that these positioning devices may hold the work K at a predetermined position of the platen 1 as the work K is carried in by the belt conveyer 7.

Figure 6:
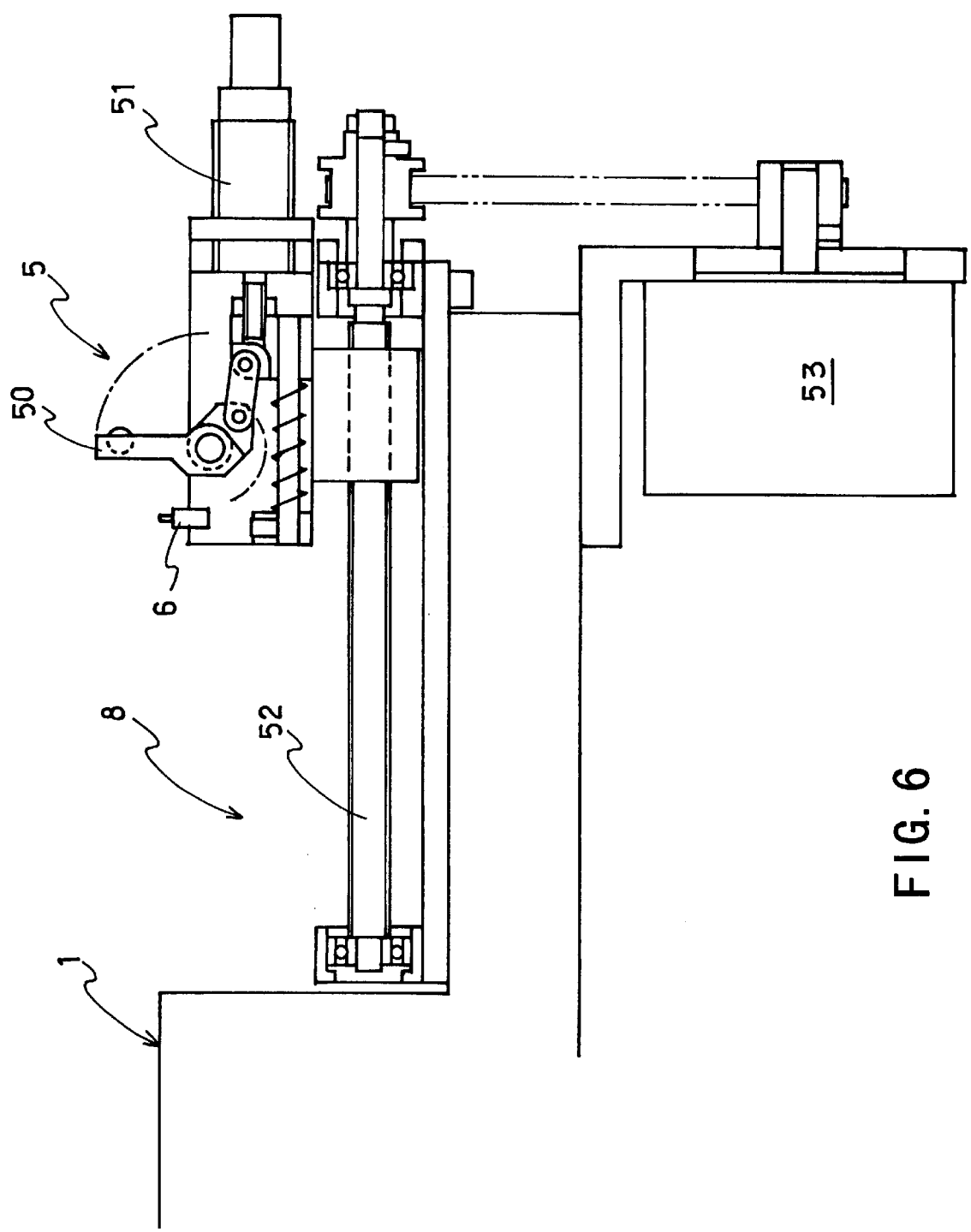
FIG. 6 is a side elevational view of a positioning device of the embodiment.

Each of the positioning devices 5 is provided in each of grooves 8 which are formed on the platen 1, and is provided with a rotatable pawl 50 for restraining an end of the work K to position the work on the platen 1 as shown in FIG. 6.

The pawl 50 is rotated by an air cylinder 51 which is controlled by the control device 10. The pawl 50 may be of a vertically moving structure instead of the rotational one.

The pawl 50 is mounted on a ball screw 52 which is driven by a motor 53 which is controlled by the control device 10, so that the pawl 50 may be moved to and away from the center of the platen 1.

In FIG. 4, the positioning device 5A1 on the right side of the platen 1 is provided with a sensor 6 which senses the work K approaching and gives the signal to the control device 10, so that the control device 10 may control the work positioning operations of the pawl 50 in accordance with the size of the work K through the motor 53.

With the construction of the aligner as mentioned above, the work K is carried from the left side of the platen in FIG. 4. The work K as is carried will strike the positioning devices 5A1 and 5A2. Simultaneously the sensor 6 senses the work K and gives the signal. The belt conveyer 7 is then stopped. Subsequently the platen 1 is lifted so that the work K may be mounted on the platen 1. Further the positioning devices 5B1, 5B2, 5C1, 5C2, 5D1 and 5D2 are operated to position the work K at the predetermined position of the platen 1 in cooperation with the positioning devices 5A1 and 5A2, where the work K is held by the vacuum suction (not shown). Subsequently the positioning devices are operated to move the respective pawls 50 away from the work K. Thus the work positioning operations are finished and the next process is started.

Above the platen 1, the film-mask F is supported by the film-mask support 20. Above the film-mask F, there are provided the pressure film P, the transparent glass 21 and the light source 23. Above the transparent glass 21, there is provided a pair of CCD cameras 2 which are employed to confirm the alignment between the aligning marks 3 of the film-mask F and the aligning marks 4 of the work K. Namely the control device 10 is operated in response to the information from the CCD cameras 2 to move the X stage 16, Y stage 15 and the θ stage 18 and accordingly the platen 1 so that the aligning marks 4 of the work K may be in alignment with the aligning marks 3 of the film-mask F, thereby to align the work K with the film mask F. In this case, the work K is held at a predetermined position of the platen 1 in the prealigning process as mentioned above, the work K is exactly positioned in the view of the CCD cameras 2 which will make a photographic confirmation of positional requirements of the work K.

The control device 10 is then operated to lift the work K by means of the Z stage 15 until the work K comes to a position where a predetermined space is obtained between the work K and the film-mask F. Subsequently the control device 10 is operated in response to the information from the CCD cameras 2 to move the platen 1 with respect to the film-mask F by means of the X stage 16, Y stage 17 and θ stage 18, so as to align the aligning marks 4 of the work K with the aligning marks 3 of the film-mask F.

After the alignment of the film-mask F and the work K is finished, the control device 10 is operated to further lift the platen 1 while the pressure fluid is introduced from the pressure source 22 onto the rear side of the pressure film P to expand the pressure film P. The pressure film P is expanded to press the film-mask F against the work K to closely contact the former to the latter. Then the control device 10 is responsive to the information from the CCD cameras 2 to measure the aligned conditions between the aligning marks 3 of the film-mask F and the aligning marks 4 of the work K. If the displacements between the aligned marks are detected to be within the range of a predetermined tolerance, the control device 10 will operate the light source 23 to irradiate a light to expose the closely contacted film-mask F and work K.

If the displacements between the aligned marks are detected to be out of the range of a predetermined tolerance, the control device 10 will operate the pressure source 22 and accordingly the pressure film P to separate the film-mask F and the work K from each other. The control device 10 is again responsive to the information from the CCD cameras 2 to move the X, Y, Z and θ stages to align the work K with the film-mask F, and then closely contact the film-mask F against the work K and measure again the aligned conditions of the aligning marks 3 and 4. The same operations are repeated until the aligning marks 3 and 4 come to be aligned with the displacements being within the range of a predetermined tolerance.

Figure 7:
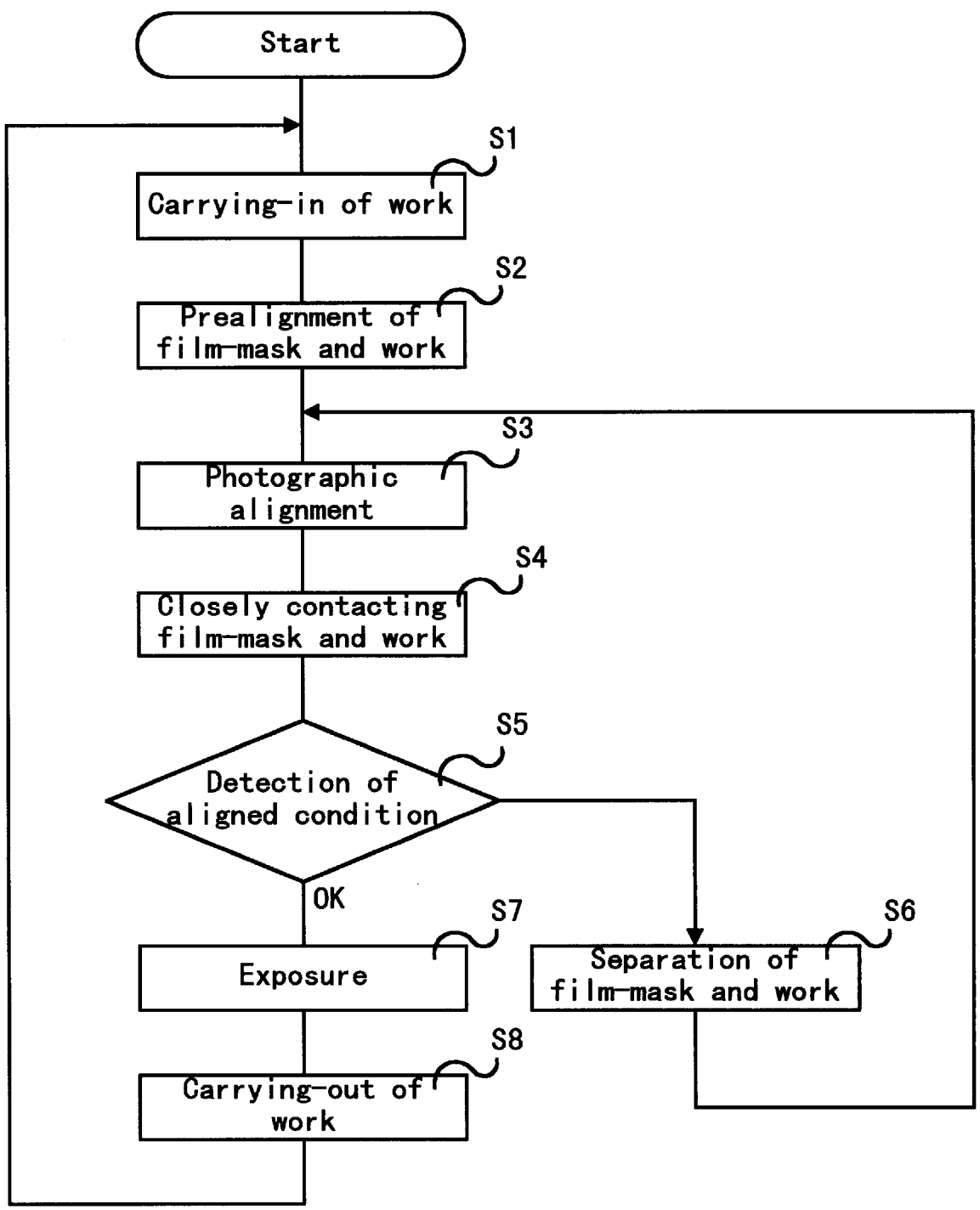
FIG. 7 is a flow chart showing the operations of the embodiment.

The sequence of operations of the embodiment will be described in reference to FIG. 7.

When the work K is carried in (step S1), the positioning devices 5 are operated to hold the work K at a predetermined position of the platen 1 (step S2). Subsequently the control device 10 is responsive to the photographic signals from the CCD cameras 2 to align the aligning marks 3 and 4 of the film-mask F and the work K with a predetermined space maintained therebetween (step S3). Subsequently the film-mask F and the work K are closely contacted with each other (step S4). In this state, the aligned condition between the aligning marks 3 and 4 is detected (step S5). If the aligned condition is detected to be out of the range of a predetermined tolerance, the closely contacted condition of the film-mask F and the work K is canceled (step S6), and the routine is returned to step S2. If the aligned condition is detected to be within the range of a predetermined tolerance, the film-mask F and the work K are exposed (step S7), and subsequently carried out (step S8).

According the embodiment of the invention as described above, the positioning devices 5 are operated to hold the work K as the latter is carried in at a predetermined position of the platen 1. The work K is, therefore, exactly positioned in view of the CCD cameras 2 which are employed to confirm the aligned condition between the work K and the film-mask F which is supported above the work K. This will remarkably increase the operation efficiency of the aligner because there is no incomplete alignment between the work K and the film-mask F. Further the operation efficiency and the positioning precision are considerably increased since the work positioning operation is performed on the platen 1 in reference to the film-mask F. Further if a delicate displacement is found between the work K and the film-mask F when these are closely contacted with each other, such a displacement is detected and the aligning operation is repeated. Therefore there will not be the products of inferior quality which may otherwise produced due to the incomplete alignment.

The work K can be a base board having a circuit pattern printed thereon.

The entire disclosure of Japanese patent Applications No. 8-217841 filed on Jul. 31, 1996 and No. 8-231490 filed on Aug. 13, 1996, including specifications, claims, drawings and summaries are incorporated herein by reference in their entirety.

What is claimed is:

1. An aligner comprising:
    an aligning device for relatively moving and aligning a mask having a pattern depicted thereon to be exposed and an object having a photosensitive layer to be subject to the exposure through said mask;
    a contacting device for contacting said mask and said object as aligned;
    a detecting device for detecting the alignment accuracy of said mask and said object as contacted;
    separating means responsive to said detecting device for separating said mask and said object from each other when the alignment accuracy of said contacted mask and object is detected by said detecting device to be out of a predetermined tolerance and in order to align said mask and said object again; and
    an exposure apparatus for exposing said mask to said object as contacted with each other.

2. The aligner as defined in claim 1, wherein said aligning operations are performed in an exposure section of an exposure device.

3. The aligner as defined in claim 1, wherein said mask is a film-mask.

4. The aligner as defined in claim 1, wherein said object is a base board having a circuit pattern printed thereon.

5. An aligner comprising:
    a prealigning device for prealigning an object in a predetermined position, said object being adapted to be exposed;
    an aligning device for relatively moving and aligning said object as prealigned for exposure and a mask having a pattern depicted thereon to be exposed;
    a contacting device for contacting said mask and said object as aligned;
    a detecting device for detecting the alignment accuracy of said mask and said object as contacted;
    separating means responsive to said detecting device for separating said mask and said object from each other when the alignment accuracy of said closely contacted mask and object is detected by said detecting device to be out of a predetermined tolerance and in order to align said mask and said object again; and
    an exposure apparatus for exposing said mask to said object as contacted with each other.

6. The aligner as defined in claim 5, wherein said aligning operations are performed in an exposure section.

7. The aligner as defined in claim 5, wherein said mask is a film-mask.

8. The aligner as defined in claim 5, wherein said object is a base board having a circuit pattern printed thereon.

* * * * *